(12) United States Patent
Granstrom et al.

(10) Patent No.: US 12,454,629 B2
(45) Date of Patent: Oct. 28, 2025

(54) CMP SLURRIES

(71) Applicant: FUJIMI INCORPORATED, Kiyosu (JP)

(72) Inventors: Jimmy Granstrom, Tualatin, OR (US); Hisashi Takeda, Tualatin, OR (US)

(73) Assignee: FUJIMI INCORPORATED, Kiyosu (JP)

( * ) Notice: Subject to any disclaimer, the term of this patent is extended or adjusted under 35 U.S.C. 154(b) by 808 days.

(21) Appl. No.: 17/480,399

(22) Filed: Sep. 21, 2021

(65) Prior Publication Data
US 2022/0098442 A1 Mar. 31, 2022

Related U.S. Application Data

(60) Provisional application No. 63/083,461, filed on Sep. 25, 2020.

(51) Int. Cl.
| | |
|---|---|
| *H01L 21/306* | (2006.01) |
| *C09G 1/02* | (2006.01) |
| *C09K 3/14* | (2006.01) |
| *H01L 21/304* | (2006.01) |

(52) U.S. Cl.
CPC .............. *C09G 1/02* (2013.01); *C09K 3/1409* (2013.01); *H01L 21/304* (2013.01)

(58) Field of Classification Search
CPC . H01L 21/3212; H01L 21/30625; C09G 1/00; C09G 1/02
See application file for complete search history.

(56) References Cited

U.S. PATENT DOCUMENTS

| | | | |
|---|---|---|---|
| 4,992,135 A | * | 2/1991 | Doan .................. C23F 3/00 438/692 |
| 8,759,216 B2 | | 6/2014 | Dysard et al. |
| 9,558,959 B2 | | 1/2017 | Mishra et al. |
| 10,428,241 B2 | | 10/2019 | Mishra |
| 10,478,939 B2 | * | 11/2019 | Yoshizaki ............... B24B 37/00 |
| 2009/0176371 A1 | | 7/2009 | Babu et al. |

(Continued)

FOREIGN PATENT DOCUMENTS

| | | |
|---|---|---|
| EP | 2 927 294 A1 | 10/2015 |
| JP | 2015-201644 A | 11/2015 |

(Continued)

OTHER PUBLICATIONS

TW Office Action Issued in Corresponding Taiwanese Application No. 110132817 Dated Oct. 4, 2024 (16 pages).

(Continued)

*Primary Examiner* — Thomas T Pham
(74) *Attorney, Agent, or Firm* — Foley & Lardner LLP (57) ABSTRACT

The present technology generally relates to compositions and methods for polishing surfaces comprising a metal and a dielectric film material. Embodiments include methods for polishing a surface comprising W, TEOS/SiO$_2$ and SiN, comprising applying a polishing slurry comprising an abrasive, a SiN polishing rate enhancer, and an anionic surfactant, and methods of buffering a metal oxide salt in a CMP slurry to obtain an increased robustness against TEOS removal comprising polishing a surface comprising a metal and TEOS by applying a polishing slurry comprising an anionic modified colloidal silica abrasive and an anionic surfactant.

11 Claims, 2 Drawing Sheets

(56) References Cited

U.S. PATENT DOCUMENTS

| | | | |
|---|---|---|---|
| 2015/0284593 A1 | 10/2015 | Wang et al. | |
| 2015/0376458 A1 | 12/2015 | Grumbine et al. | |
| 2015/0376463 A1* | 12/2015 | Fu | C09K 3/14 |
| | | | 438/693 |
| 2017/0298253 A1 | 10/2017 | Ishida | |
| 2018/0371292 A1 | 12/2018 | Wang | |
| 2019/0093056 A1* | 3/2019 | Yoshino | C11D 3/3707 |
| 2020/0090997 A1 | 3/2020 | Nieh et al. | |
| 2020/0115661 A1* | 4/2020 | Grandstrom | C11D 1/06 |

FOREIGN PATENT DOCUMENTS

| | | |
|---|---|---|
| JP | 2017-019893 A | 1/2017 |
| JP | 2017-524767 A | 8/2017 |
| JP | 2019-189812 A | 10/2019 |
| WO | WO-2015/200679 A1 | 12/2015 |

OTHER PUBLICATIONS

JP Notice of Reasons for Refusal Issued in JP Appl. Ser. No. 2021-154306 Dated Feb. 12, 2025 (10 pages).
SG Office Action issued in corresponding Singapore Application No. 10202109945X Dated Jun. 30, 2025 (10 pages).

* cited by examiner

CMP SLURRIES

TECHNICAL FIELD

The present technology generally relates to compositions and methods for polishing surfaces comprising a metal and a dielectric film material.

BACKGROUND

Silicon nitride (SiN) chemical mechanical polishing (CMP) slurries are used for a wide range of applications. In addition, tungsten (W) can be part of the patterned wafer.

SUMMARY OF THE DISCLOSURE

Provided herein are novel compositions and novel methods for polishing surfaces comprising a metal and a dielectric film material.

Certain aspects of the disclosure include a method for polishing a surface comprising W, TEOS/$SiO_2$ and SiN, comprising applying a polishing slurry comprising an abrasive, a SiN polishing rate enhancer, and an anionic surfactant. In some embodiments, the abrasive is an anionic modified colloidal silica using sulfonate chemical. In some embodiments, the anionic modified colloidal silica was treated with a sulfonate chemical. In some embodiments, the electrical conductivity value of the polishing slurry is less than 300 µS/cm. In some embodiments, the electrical conductivity value of the polishing slurry is greater than 100 µS/cm. In some embodiments, the polishing slurry has a pH of about 4 to about 5. In some embodiments, the SiN polishing rate enhancer is selected from the group consisting of an amino acid and heterocycle carbon compounds. In some embodiments, the anionic surfactant is selected from a sulfonic acid type surfactant. In some embodiments, an amount of SiN polishing rate enhancer is about 0.05 to about 0.5 wt. %. In some embodiments, an amount of abrasive is about 0.8 wt. % or less. In some embodiments, the ratio of SiN removal to TEOS removal during polishing is greater than about 40:1. In some embodiments, the polishing is performed in the presence of $WO_4^{2-}$. Here, TEOS means tetraethyl orthosilicate, and TEOS/$SiO_2$ indicates that silicon oxide ($SiO_2$) is a silica oxide film derived from tetraethyl orthosilicate.

Certain aspects of the disclosure include a method of buffering a metal oxide salt in a CMP slurry to obtain an increased robustness against TEOS removal comprising polishing a surface comprising a metal and TEOS by applying a polishing slurry comprising an anionic modified colloidal silica abrasive and an anionic surfactant. In some embodiments, the electrical conductivity value of the polishing slurry is less than 300 µS/cm. In some embodiments, the metal is W and the metal oxide salt includes a $WO_4^{2-}$ anion. In some embodiments, the surface further comprises SiN, and the polishing slurry further comprises a SiN polishing rate enhancer. In some embodiments, the polishing slurry has a pH of about 4 to about 5.

Certain aspects of the disclosure include a CMP composition comprising an anionic modified colloidal silica abrasive, a SiN polishing rate enhancer, and an anionic surfactant, wherein the anionic modified colloidal silica abrasive is present in an amount of 1 wt. % or less, and the ratio of abrasive to SiN polishing rate enhancer is within the range of about 1.5 to 1 to about 1.9 to 1. In some embodiments, the CMP composition has a pH of about 4 to about 5. In some embodiments, the SiN polishing rate enhancer is β-alanine.

Certain aspects of the disclosure include a method for polishing a surface comprising W, TEOS/$SiO_2$ and SiN, comprising applying a polishing slurry comprising an abrasive, a SiN polishing rate enhancer, and an anionic surfactant, and the electrical conductivity value is 100 µS/cm to 350 µS/cm.

Certain aspects of the disclosure include a method of buffering a metal oxide salt in a CMP slurry to obtain an increased robustness against TEOS removal comprising polishing a surface comprising a metal and TEOS by applying a polishing slurry comprising an anionic modified colloidal silica abrasive and an anionic surfactant, and the electrical conductivity value is 100 µS/cm to 350 µS/cm.

Certain aspects of the disclosure include a CMP composition comprising an anionic modified colloidal silica abrasive, a SiN polishing rate enhancer, and an anionic surfactant, wherein the anionic modified colloidal silica abrasive is present in an amount of 1 wt. % or less, and the ratio of abrasive to SiN polishing rate enhancer is within the range of about 1.5 to 1 to about 1.9 to 1, and the electrical conductivity value is 100 µS/cm to 350 µS/cm.

DETAILED DESCRIPTION

Provided herein are CMP compositions and methods for polishing surfaces comprising a metal and a dielectric film material. As used herein, the term "chemical mechanical polishing" or "planarization" refers to a process of planarizing (polishing) a surface with the combination of surface chemical reaction and mechanical abrasion. In some embodiments, the chemical reaction is initiated by applying to the surface a composition (interchangeably referred to as a 'polishing (CMP) slurry,' a 'CMP composition,' a 'polishing composition,' a 'slurry composition' or simply a 'slurry') capable of reacting with a surface material, thereby turning the surface material into a product that can be more easily removed by simultaneous mechanical abrasion. In some embodiments, the mechanical abrasion is performed by contacting a polishing pad with the surface and moving the polishing pad relative to the surface.

Composition

The CMP polishing compositions disclosed herein can comprise, consist essentially of, or consist of one or more of the following components. Here, "consist essentially of" means that a component not intended to be added to the composition (a component other than the components described below) may be contained in the composition for CMP polishing, for example, up to 0.001% by weight as an upper limit.

Abrasive

The CMP compositions of the present disclosure contain at least one abrasive. The abrasive in the CMP composition provides or enhances mechanical abrasion effects during the CMP process. Examples of abrasives that can be used in connection with the present disclosure include but are not limited to alumina abrasive, silica abrasive, ceria abrasive, titanium oxide, zirconia, or mixtures thereof.

In some embodiments, the abrasive is an anionic modified colloidal silica. In some embodiments, the anionic modified colloidal silica is modified using sulfonate chemical. Thus, in some embodiments, the CMP composition includes anionic modified colloidal silica that includes an anionic group (for example, a sulfonic acid group) bonded to a surface of particles of raw colloidal silica. In some embodiments, anionic modified colloidal silica modified using sulfonate chemicals, for example, can be prepared by method described in "Sulfonicacid-functionalized silica through quantitative oxidation of thiol groups", Chem. Commun. 246-247 (2003). Specifically, silica with sulfonic acid immobilized on the surface can be obtained by coupling a silane coupling agent having a thiol group such as 3-mercaptopropyltrimethoxysilane to silica and then oxidizing the thiol group with hydrogen peroxide.

The raw colloidal silica can be, for example, colloidal silica produced by a sol-gel method. The production of the raw colloidal silica by a sol-gel method can be performed by using a conventionally known technique, specifically, by using a hydrolyzable silicon compound (for example, an alkoxysilane or a derivative thereof) as a raw material, hydrolysis and condensation reaction is performed, as a result of which the raw colloidal silica can be obtained. The silicon compound may be used singly alone or may also be used in combination of two or more kinds thereof. Further, the raw colloidal silica may also be the one produced by a method other than the sol-gel method. In some embodiments, the average primary particle size of the abrasive is 5 nm or more, 6 nm or more, 7 nm or more, 8 nm or more, 9 nm or more, 10 nm or more, 11 nm or more, 12 nm or more, or 13 nm or more. In some embodiments, the average primary particle size of the abrasive is 33 nm or less, 30 nm or less, 25 nm or less, 20 nm or less, 19 nm or less, 17 nm or less, or 15 nm or less. The average primary particle size of the abrasive may be calculated from the specific surface area of the abrasive grains by the BET method measured using "Flow SorbII 2300" manufactured by Micromeritex Co., Ltd. and the density of the abrasive grains. In some embodiments, the average secondary particle size of the abrasive is 21 nm or more, 23 nm or more, 25 nm or more, 27 nm or more, 29 nm or more, 31 nm or more, or 33 nm or more. In some embodiments, the average secondary particle size of the abrasive is 60 nm or less, 50 nm or less, 45 nm or less, 40 nm or less, 38 nm or less, or 36 nm or less. The average secondary particle size of the abrasive may be calculated by a dynamic light scattering method measured using "Zeta sizer" manufactured by Malvern Panalytical. In some embodiments, the present CMP composition comprises about 0.01% to about 2% by weight of the abrasive. In some embodiments, the present CMP composition comprises less than 2% by weight of the abrasive. In some embodiments, the present CMP composition comprises less than 1% by weight, less than 0.9% by weight, less than 0.8% by weight, less than 0.7% by weight, less than 0.6% by weight, less than 0.5% by weight, less than 0.4% by weight, less than 0.3% by weight, or less than 0.2% by weight of the abrasive. In some embodiments, the present CMP composition comprises 2% by weight or less, 1.5% by weight or less, 1.2% by weight or less, 1% by weight or less, 0.9% by weight or less, 0.8% by weight or less, 0.7% by weight or less, 0.6% by weight or less, 0.5% by weight or less, 0.4% by weight or less, 0.3% by weight or less, or 0.2% by weight or less of the abrasive. In some embodiments, the present CMP composition comprises 0.01% by weight or more, 0.05% by weight or more, 0.1% by weight or more, 0.3% by weight or more, 0.5% by weight or more, or 0.7% by weight or more of the abrasive.

SiN Polishing Rate Enhancer

Certain embodiments of the CMP compositions of the present disclosure contain at least one SiN polishing rate enhancer. In some embodiments, the SiN polishing rate enhancer is selected from the group consisting of an amino acid and heterocycle carbon compounds. In some embodiments, the amino acid is a structure where an amino group is attached to the end of an alkylene group, and a carboxyl group is attached to the opposite end. Non-limiting examples of suitable amino acids include β-alanine and 5-aminovaleric acid. In some embodiments, the alkylene group has 1 to 4, 1 to 3, or 1 or 2 carbon atoms. Non-limiting examples of suitable heterocycle carbon compounds include a heterocycle containing at least one ring nitrogen, e.g., azole, triazole and pyrazine. Specific compounds include 3-amino-1,2,4-triazole, 3-mercapto-1,2,4-triazole, guanazole or aminopyrazine. Other compounds known to function as a SiN polishing rate enhancer are also included in this disclosure.

In some embodiments, the present CMP composition comprises about 2% by weight or less of the SiN polishing rate enhancer. In some embodiments, the present CMP composition comprises about 1% by weight or less of the SiN polishing rate enhancer. In some embodiments, the present CMP composition comprises about 0.05 to about 0.5% by weight of the SiN polishing rate enhancer. In some embodiments, the present CMP composition comprises 0.05% by weight or more, 0.06% by weight or more, 0.07% by weight or more, 0.08% by weight or more, 0.09% by weight or more, 0.1% by weight or more, 0.2% by weight or more, 0.3% by weight or more, or 0.4% by weight or more of the SiN polishing rate enhancer. In some embodiments, the present CMP composition comprises 2% by weight or less, 1.5% by weight or less, 1.0% by weight or less, 0.9% by weight or less, less than 0.89% by weight, 0.85% by weight or less, 0.8% by weight or less, 0.7% by weight or less, 0.6% by weight or less, or 0.5% by weight or less of the SiN polishing rate enhancer. In some embodiments, the present CMP composition comprises about 0.1% by weight, about 0.2% by weight, about 0.3% by weight, about 0.4% by weight, about 0.5% by weight, about 0.6% by weight, about 0.7% by weight, about 0.8% by weight, about 0.9% by weight or about 1% by weight of the SiN polishing rate enhancer. The numerical value in this embodiment can be used as the legal basis for the upper limit or the lower limit of the concentration of the SiN polishing rate enhancer. In other words, it is the legal basis or support for amendment. For example, the present CMP composition comprises about 0.2% by weight to about 0.9% by weight, about 0.3% by weight to about 0.8% by weight, or about 0.4% by weight to about 0.7% by weight of the SiN polishing rate enhancer.

In some embodiments, the abrasive is present in a higher amount than the SiN polishing rate enhancer. In some embodiments, the ratio (the weight ratio) of abrasive to SiN polishing rate enhancer is within the range of about 1.5 to 1 to about 1.9 to 1. For example, in some embodiments, the ratio of abrasive to SiN polishing rate enhancer is about 1.5:1, 1.6:1, 1.7:1, 1.8:1, 1.9:1. In the embodiment, the ratio of abrasive to SiN polishing rate enhancer can be the legal basis for the upper or lower limit of the ratio of abrasive to SiN polishing rate enhancer. In other words, it is the legal basis for amendment. For example, the ratio of abrasive to SiN polishing rate enhancer is about 1.5:1 to 1.7:1, about 1.5:1 to 1.8:1, about 1.5:1 to 1.9:1.

Anionic Surfactant

Certain embodiments of the CMP compositions of the present disclosure contain at least one anionic surfactant. In some embodiments, the anionic surfactant is a sulfonic acid type surfactant. For example, ammonium alkyl polyoxyethylene ether sulfates are included by this disclosure. Specific examples include ammonium alkyl polyoxyethylene ether sulfates with nonylphenyl, styrenated phenyl, isodecyl or lauryl alkyl groups. Other compounds known to function as an anionic surfactant in CMP compositions are included by this disclosure. In some embodiments, the anionic surfactant is a sulfonic acid surfactant containing a benzene ring or a naphthalene ring. In some embodiments, the anionic surfactant is alkylbenzene sulfonic acid or a salt thereof, or alkylnaphthalene sulfonic acid or a salt thereof. In some embodiments, the alkyl group contained in the sulfonic acid surfactant has a straight chain or a branched chain. Having a branched chain efficiently leads the desired effect of the present invention. In some embodiments, the sulfonic acid surfactant contains two or more or three or more alkyl groups. In some embodiments, the sulfonic acid surfactant contains 4 or less alkyl groups. In some embodiments, the salt is preferably a sodium salt, an ammonium salt or the like.

In some embodiments, the present CMP composition comprises about 0.1% by weight or less of surfactant. For example, in some embodiments, the present CMP composition comprises less than 0.01% by weight, less than 0.005% by weight, less than 0.002% by weight, less than 0.001% by weight, less than 0.0009% by weight, less than 0.0008% by weight, less than 0.0007% by weight, less than 0.0005% by weight, less than 0.0004% by weight, less than 0.0003% by weight, or less than 0.0002% by weight of anionic surfactant. The present CMP composition comprises 0.01% by weight or less, 0.005% by weight or less, 0.002% by weight or less, 0.001% by weight or less, 0.0009% by weight or less, 0.0008% by weight or less, 0.0007% by weight or less, 0.0005% by weight or less, 0.0004% by weight or less, 0.0003% by weight or less, or 0.0002% by weight or less of anionic surfactant. In some embodiments, the present CMP composition comprises 0.00005% by weight or more, 0.0001% by weight or more, 0.0002% by weight or more, 0.0003% by weight or more, 0.0004% by weight or more, 0.0005% by weight or more, or 0.0006% by weight or more of surfactant.

Additional Components

The liquid carrier of the CMP composition is not particularly limited. In some embodiments, the liquid carrier is water, such as deionized water. The liquid carrier may also be an aqueous solution that has, e.g., an appropriate pH modifier contained therein. In some embodiments, the liquid carrier can contain one or more organic solvents, such as alcohol compounds, such as fatty alcohols containing 2 to 6 carbon atoms. In some embodiments, the liquid carrier can contain one or more organic solvents, such as glycol ether containing 3 to 10 carbon atoms.

Examples of aliphatic alcohols with 2 to 6 carbon atoms include ethanol, 1-propanol, 2-propanol, 1-butanol, 2-butanol, tert-butanol, pentanol, hexanol, ethylene glycol, propylene glycol, 1,3-butanediol, 1,4-butanediol, 1,5-pentanediol, 1,6-hexanediol, glycerin, 1,2,4-butanetriol, 1,2,6-hexanetriol, erythritol, D-threitol, L L-threitol, D-arabinitol, L-arabinitol, ribitol, xylitol, mannitol, and sorbitol. Examples of glycol ethers with 3 to 10 carbon atoms include methyl glycol, methyl diglycol, methyl triglycol, isopropyl glycol, isopropyl diglycol, butyl glycol, butyl diglycol, butyl triglycol, isobutyl glycol, isobutyl diglycol, hexyl glycol, hexyl diglycol, 2-ethylhexyl glycol, 2-ethylhexyl diglycol, aryl glycol, phenyl glycol, phenyl diglycol, benzyl glycol, methylpropylene glycol, methylpropylene diglycol, methylpropylene triglycol, propylpropylene glycol, propylpropylene diglycol, butylpropylene glycol, butylpropylene diglycol, and phenylpropylene glycol. In some embodiments, in the liquid carrier, water is 90% by weight or more, 95% by weight or more, 98% by weight or more, 99% by weight or more, or 99.5% by weight or more.

In some embodiments, the pH of the CMP composition is a value of from about 3 to about 7. In some embodiments, the pH of the CMP composition is a value of from about 3 to about 6. For example, the pH may be about 4 to about 5. In some embodiments, the pH of the CMP composition is 3 or more, 4 or more, 4.5 or more, or 4.8 or more. In some embodiments, the pH of the CMP composition is less than 7, 6.5 or less, 6.2 or less, 6.0 or less, 5.8 or less, 5.5 or less, 5.3 or less, or 5 or less. Considering the desired effect of the present invention, it is preferable that the pH does not exceed 5. In some embodiments, suitable pH regulators and/or buffers may be included in the composition to adjust the pH. The pH of the CMP composition (liquid temperature: 25° C.) can be confirmed with a pH meter (HORIBA, Ltd. model number: LAQUA). For SiN bulk/buff slurries, one key performance metric is high SiN:TEOS removal rate selectivity to obtain minimum tetraethyl orthosilicate (TEOS) dishing. While at pH ≥4 there may be W dissolution into $WO_4^{2-}$ (corrosion). If dissolution of the W film occurs during CMP and results in a localized electrical conductivity (EC) increase near an adjacent TEOS structure on a patterned wafer, it potentially affects SiN:TEOS removal rate selectivity and subsequently TEOS dishing. Accordingly, in some embodiments, even if the pH of the CMP composition is particularly 4 or higher, novel CMP compositions that have high dielectric film material (e.g., SiN:TEOS) removal rate selectivity in the presence of a metal, such as W, can be provided. In addition, at pH<4, a passivating $WO_3$ film can be formed. In some embodiments, the "sweet spot" for SiN:TEOS selectivity may be in the range pH 4 to 5. Thus, in some embodiments, the SiN:TEOS selectivity can be improved even within pH 4 to 5, where there may be an EC increase due to $WO_4^{2-}$ formation. In some embodiments, the metal may not be W, for example, it may be Mo.

In some embodiments, an acid is used as the pH-adjusting agent. The acid used in connection with the present invention can be organic or inorganic compounds. Examples of the acid include inorganic acids such as sulfuric acid, nitric acid, boric acid, carbonic acid, hypophosphorous acid, phosphorous acid, and phosphoric acid; and organic acids such as carboxylic acids including formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and organic sulfuric acids including methanesulfonic acid, ethanesulfonic acid, and isethionic acid. Content of the acid in the slurry is not particularly limited as long as it is an amount allowing the slurry to be within the aforementioned pH range.

In some embodiments, the composition according to the present disclosure may also comprise a biocide or other preservative. Examples of preservatives and biocides that may be used in connection with the present invention include an isothiazoline-based preservative such as 2-methyl-4-isothiazolin-3-one or 5-chloro-2-methyl-4-isothiazolin-3-one, paraoxybenzoate esters, and phenoxyethanol, and the like. These preservatives and biocides may be used either alone or in mixture of two or more kinds thereof.

In certain embodiments, the electrical conductivity value of the polishing slurry is less than about 300 μS/cm. In certain embodiments, the electrical conductivity value of the polishing slurry is greater than 100 μS/cm. In addition, the electric conductivity of the polishing slurry can be evaluated by a desktop electric conductivity meter (manufactured by HORIBA, Ltd., model number: DS-71). In some embodiments, the electrical conductivity value of the polishing slurry is 400 μS/cm or less, 380 μS/cm or less, 360 μS/cm or less, 340 μS/cm or less, 320 μS/cm or less, 300 μS/cm or less, 280 μS/cm or less, 260 μS/cm or less, 240 μS/cm or less, 220 μS/cm or less, 200 μS/cm or less, 190 μS/cm or less, 180 μS/cm or less, or 170 μS/cm or less. In some embodiments, the electrical conductivity value of the polishing slurry is 80 μS/cm or more, 90 μS/cm or more, 100 μS/cm or more, 120 μS/cm or more, 140 μS/cm or more, 160 μS/cm or more, 170 μS/cm or more, 180 μS/cm or more, 190 μS/cm or more, or 200 μS/cm or more.

Methods

In another aspect of the present disclosure, provided herein are methods for CMP of a surface. For example, a method for polishing a surface comprising W, TEOS/SiO$_2$ and SiN, comprising applying a polishing slurry comprising an abrasive, a SiN polishing rate enhancer, and an anionic surfactant of the embodiments of the present disclosure. Certain embodiments can comprise contacting the surface with a polishing pad; delivering a polishing slurry according to the present disclosure to the surface; and polishing said surface with the polishing slurry. In some embodiments, the polishing is performed in the presence of $WO_4^{2-}$. In some embodiments, the ratio of SiN removal to TEOS removal during polishing is greater than about 40:1. In some embodiments, the ratio of SiN removal to TEOS removal during polishing is greater than 42:1, greater than 44:1, greater than 46:1, or greater than 48:1. In some embodiments, the ratio of SiN removal to TEOS removal during polishing is less than 200:1 or less than 150:1.

In another aspect of the disclosure, provided herein a method of buffering a metal oxide salt in a CMP slurry to obtain an increased robustness against TEOS removal, comprising polishing a surface comprising a metal (e.g., W, Mo) and TEOS by applying a polishing slurry comprising an anionic modified colloidal silica abrasive and an anionic surfactant. In addition, robustness will be described in relation to the Table 4 described later. Certain embodiments can comprise contacting the surface with a polishing pad; delivering a polishing slurry according to the present disclosure to the surface; and polishing said surface with the polishing slurry. In some embodiments, the metal is W and the metal oxide salt includes a $WO_4^{2-}$ anion. In some embodiments, the surface further comprises SiN, and the polishing slurry further comprises a SiN polishing rate enhancer. In some embodiments, the ratio of SiN removal to TEOS removal during polishing is greater than about 40:1. In some embodiments, the ratio of SiN removal to TEOS removal during polishing is greater than 42:1, greater than 44:1, greater than 46:1, or greater than 48:1. In some embodiments, the ratio of SiN removal to TEOS removal during polishing is less than 200:1, or less than 150:1.

EXAMPLES

Example 1: SiN:TEOS Selectivity and W Dissolution

The effects on SiN:TEOS selectivity and W dissolution for different pH regimes are summarized in Table 1. The trends described in Table 1 apply to the interaction of each wafer type (SiN or TEOS) with particles having a negative zeta potential across the whole pH range (pH 2 to pH 12).

TABLE 1 pH effect on SiN:TEOS selectivity and W dissolution in three pH regimes

| Effect on: | pH < 4 | pH 4-5 | pH > 5 |
|---|---|---|---|
| SiN RR | High RR (large attraction to particle) | Medium RR (attraction to particle) | Low RR (repulsion) |
| TEOS RR | Medium RR (small attraction to particle) | Low RR (repulsion from particle) | Low RR (repulsion) |
| W dissolution | $WO_3$ passivation → No $WO_4^{2-}$ forms | $WO_4^{2-}$ forms → Higher EC increasing TEOS RR | |

Table 2 shows the ingredients and amounts for slurries in this study, as well as electrical conductivity (EC) values. A higher amount of β-alanine, which is a SiN removal rate enhancer and key element for slurry design, was used for slurries to compensate for their lower abrasive amounts versus Slurry A.

TABLE 2

Measured electrical conductivity (EC) values and ingredients in slurries (all at pH 5 with 0.04 wt. % Triisopropylnaphthalene sulfonic acid Na salt). Maleic acid was used as pH adjustor.

| | | Ingredient amount at PoU (wt. %) | | | |
|---|---|---|---|---|---|
| Slurry | Electrical conductivity (μS/cm) at PoU * | Abrasive (Anionic colloidal silica)$^a$ | β-alanine | Triisopropyl-naphthalene sulfonic acid Na salt | Maleic acid |
| A | 86 | 1 | 0.089 | 0.00066 | 0.017 |
| B | 387 | 0.75 | 0.89 | 0.00066 | 0.043 |
| C | 165 | 0.75 | 0.45 | 0.00066 | 0.024 |
| D | 204 | 0.75 | 0.45 | 0.00066 | 0.025 |

$^a$Primary particle size: 14 nm; Secondary particle size: 34 nm; The anionic silica has sulfonic acid group on abrasive surface.

A TEOS removal rate increase caused by a localized EC increase from $WO_4^{2-}$ formation would be due to the contraction of the electrical double layer around the particle, and hence a higher localized TEOS removal rate and potentially higher TEOS dishing on patterned wafers.

Figure 1:
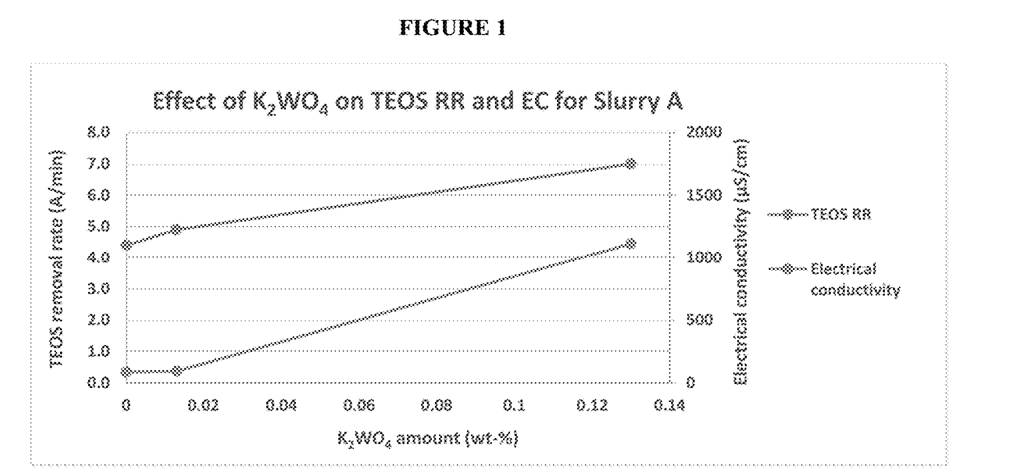
FIG. 1 shows the effect of $K_2WO_4$ on TEOS removal rate and electrical conductivity (EC) for a certain CMP composition.

The issue with low TEOS removal rate robustness to $WO_4^{2-}$ can be clearly seen for Slurry A in FIG. 1, showing an increase in TEOS removal rate as the electrical conductivity increases as an increasing amount of $K_2WO_4$ gets added to the slurry. FIG. 1 shows that $K_2WO_4$ was intentionally added to slurry A so that the amount of $K_2WO_4$ is shown on the X-axis of each plot, their electrical conductivity was measured, and the removal rate of TEOS using them under the polishing conditions shown in Table 4 is shown on the Y-axis. An elevated $K_2WO_4$ amount is believed to simulate the high $WO_4^{2-}$ chemical environment for TEOS near W on patterned wafers at pH≥4.

In order to evaluate the effect of W polishing on TEOS removal rate, an experimental polishing procedure was designed for W and TEOS blanket test wafers (blanket wafers), see Table 3. The experimental procedure aims to simulate the localized increase in $WO_4^{2-}$ for TEOS lines near W lines on patterned wafers.

Two blanket wafers were prepared as a first wafer and a second wafer. In addition, ex-situ conditioning was performed to process the pads. After polishing the first wafer using the pad, the second wafer was polished. No conditioning was performed between the polishing of the first wafer and the polishing of the second wafer. For example, after polish of the first wafer, high pressure rinse with deionized water or pad conditioning was not performed. By doing so, TEOS removal rates were determined after the second polish.

More specifically, the TEOS blanket wafer was polished with Slurry A for 8 minutes using a pad subjected to ex-situ conditioning. Subsequently, the Slurry A was used to polish another TEOS blanket wafer for 4 minutes ("a" in Table 3, 8 minutes TEOS/4 minutes TEOS). At this time, the pad cleaning or conditioning step was not performed between the polishing of each wafer.

In addition, the W blanket wafer was polished with Slurry A for 8 minutes using a pad subjected to ex-situ conditioning. Subsequently, the TEOS blanket wafer was polished for 4 minutes using the Slurry A ("b" in Table 3, 8 minutes W/4 minutes TEOS). At this time, the pad cleaning and conditioning step was not performed between the polishing of each wafer.

Table 3 briefly summarizes the procedure and purpose of the above experiment. The point of this experiment is that the pad cleaning and conditioning steps were not performed between the polishing of each wafer. By not performing such cleaning and conditioning, the pad after polishing the first wafer contains a product derived from the first wafer. That is, regarding b) 8-minute W/4-minute TEOS, the first wafer-derived product contains W (including the dissolved form of W) and the like, and by polishing the TEOS blanket wafer with a pad containing the W (including the dissolved form of W) and the like, the influence of W (including the dissolved form of W) and the like on TEOS can be evaluated.

TABLE 3

Runs and wafers used for the experimental procedure to check the effect of W polishing on TEOS RR for the slurries in Table 2.

| Run | blanket wafer #1 | blanket wafer #2 | Purpose |
| --- | --- | --- | --- |
| a) 8 min. TEOS/ 4 min. TEOS (ex-situ) | 8 min. TEOS | 4 min. TEOS | Reference. Check the effect of no W polishing on TEOS RR |

TABLE 3-continued

Runs and wafers used for the experimental procedure to check the effect of W polishing on TEOS RR for the slurries in Table 2.

| Run | blanket wafer #1 | blanket wafer #2 | Purpose |
| --- | --- | --- | --- |
| b) 8 min. W/ 4 min. TEOS (ex-situ) | 8 min. W | 4 min. TEOS | Check the effect W polishing on TEOS RR |

Figure 2:
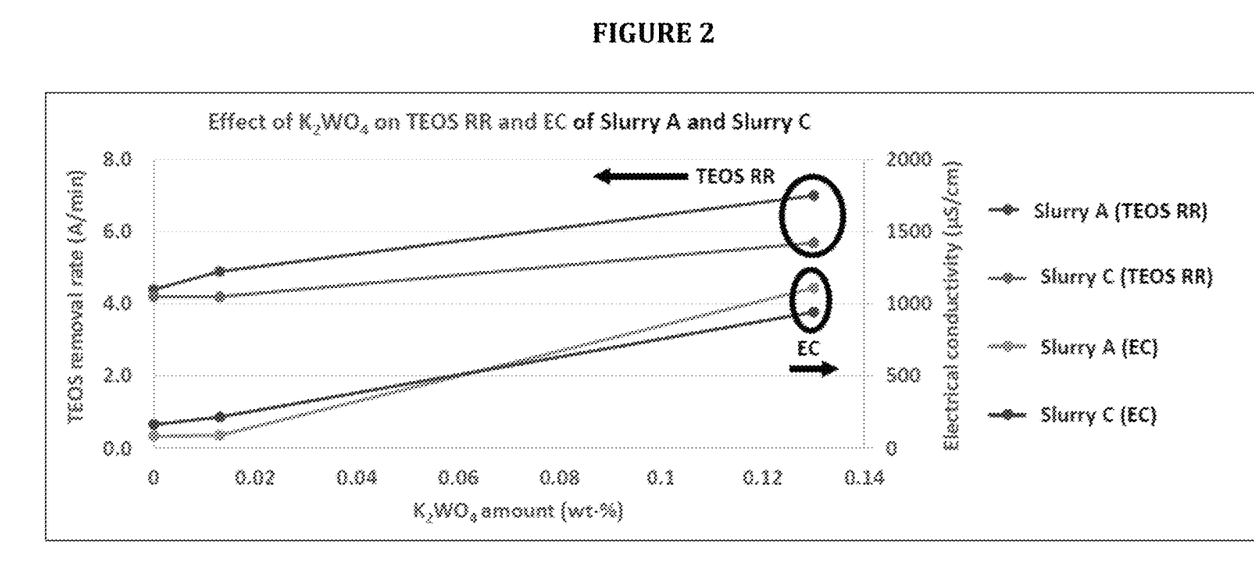
FIG. 2 shows the effect of $K_2WO_4$ on TEOS RR and electrical conductivity (EC) for additional specific CMP compositions.

FIG. 2 shows the effect of $K_2WO_4$ on TEOS removal rate and electrical conductivity (EC) for additional specific CMP compositions. More specifically, FIG. 2 shows that $K_2WO_4$ was intentionally added to slurry A and slurry C respectively so that the amount of $K_2WO_4$ are shown on the X-axis of each plot, and their electrical conductivity was measured, and the removal rate of TEOS using them under the polishing conditions shown in Table 4 is shown on the Y-axis.

As can be seen in FIG. 2, if TEOS removal rate of a slurry has a low robustness to W polishing (i.e. it is more strongly affected by $WO_4^{2-}$ in run b)), it would be expected that run b is supposed to exhibit a higher TEOS RRs (blanket wafer #2) than run a). In other words, the same or similar TEOS RRs (blanket wafer #2) for runs a) and b) may be indicative of a greater robustness against $WO_4^{2-}$ caused by W polishing, and potentially a lower TEOS dishing on patterned wafers. That is, the fact that the removal rates of 8 minutes TEOS/4 minutes TEOS (ex-situ) and 8 minutes W/4 minutes TEOS (ex-situ) are the same means that TEOS has a greater robustness against $WO_4^{2-}$.

TABLE 4

Slurry ingredient ratios versus 200 mm TEOS removal rates as a function of W polishing (ex-situ conditioning) or 200 mm blanket removal rates during regular polishing operation (in-situ conditioning).

| | 200 mm TEOS blanket wafer removal rate (A/min) * as a function of W polishing ** | | Robustness evaluation | 200 mm in-situ blanket wafer RRs (A/min) *, *** | | TEOS/SiN removal rate selectivity |
| --- | --- | --- | --- | --- | --- | --- |
| Slurry | 8 min. TEOS/ 4 min. TEOS (ex-situ) | 8 min. W/ 4 min. TEOS (ex-situ) | Absolute value of the difference between (a) and (b) | SiN | TEOS | (—) |
| A | 4.7 | 6.1 | 1.4 | 206 | 6 | 34 |
| B | 7.9 | 8.8 | 0.9 | 288 | 8 | 36 |
| C | 4.9 | 4.3 | 0.6 | 247 | 5 | 49 |
| D | 4.6 | 4.3 | 0.3 | 260 | 5 | 52 |

* Polishing condition: 1.5 psi (polishing pressure) -63 rpm (rotation speed) -125 ml/min (slurry supply speed) -IC1010 (polishing pad) -A165-Westech (200 mm) (polishing equipment name for polishing 200 mm wafers).
** W polishing effect experiment: Two wafers were polished with ex-situ pad conditioning for each run, with no high pressure rinse with deionized water or pad conditioning after polish of the first wafer. TEOS removal rate were determined after the second polish.
*** Polish times: 1 minute for SiN, 4 minutes for TEOS and W. In-situ conditioning for all runs.

Table 4 shows TEOS removal rates using the experimental procedure shown in Table 3. In order for a SiN bulk/buff slurry to be considered robust (having a robustness) and efficient, the two requirements below could be fulfilled.

1) No significant increase in TEOS removal rate with longer W polishing times. That is, the absolute value of the difference between (a) and (b) is less than 0.9. Therefore, in one embodiment, "increased robustness" means that the difference of the absolute value between (a) and (b) (also referred to as robustness value) is less than 0.9, 0.8 or less, 0.7 or less, or 0.6 or less.
2) A SiN/TEOS selectivity >40.

In one embodiment of the present invention, a polishing slurry comprising an anionic modified colloidal silica abrasive and an anionic surfactant, and the electric conductivity value is 100 µS/cm to 350 µS/cm, and the robustness value is 0.9 or less, is provided.

As can be seen in table 4, Slurry C and Slurry D fulfill both of the requirements above. It appears that there is an amount of β-alanine (or slurry EC) that is ideal in order to maintain TEOS removal rate robustness against W polishing.

Table 5 shows that $K_2WO_4$ was intentionally added (spike) to the slurries A and C so that the concentrations are shown in Table 2, and the respective electric conductivity and TEOS RRs were measured, and the results are shown. In addition, the polishing conditions in Table 5 are as shown in Table 4.

As can also be seen in Table 5, the increase in EC and TEOS removal rate with $K_2WO_4$ spike is significantly lower for Slurry C compared with Slurry A. A 0.13 wt. % $K_2WO_4$ spike (equivalent to a 1000 ppm $WO_4^{2-}$) results in a 13× increase of EC for Slurry A but only a 5.7× increase for Slurry C, hence Slurry C enables an almost 2× reduction in EC increase compared with Slurry A. Consequently, the TEOS removal rate increase Slurry C is significantly lower (1.4×) compared with the TEOS removal rate increase for Slurry A (1.6×) at 0.13 wt. % $K_2WO_4$ (1000 ppm $WO_4^{2-}$).

Table 5 helps to demonstrate the improved $WO_4^{2-}$ buffering capacity of Slurry C compared with Slurry A. An EC increase of 5.7× (Slurry C) after exposure to 1000 ppm $WO_4^{2-}$ enables a significantly lower TEOS removal rate increase compared with an EC increase of 13× (Slurry A). The data suggests that a significant difference in TEOS removal rate response should be expected within the $K_2WO_4$ range 0.013-0.13 wt. %, suggesting a wider TEOS removal rate robustness window for Slurry C versus Slurry A.

TABLE 5

Slurry ingredient amounts and effect of $K_2WO_4$ amount on EC and TEOS removal rate.

| | $K_2WO_4$ spike | | Electro conductivity | | TEOS Removal rate | |
|---|---|---|---|---|---|---|
| Slurry | $K_2WO_4$ (wt %) | Equivalent to $WO_4^{2-}$ amount (ppm) | μS/cm | Normalized EC* | Å/min | Normalized Removal rate* |
| A | 0 | 0 | 86 | 1.0 | 4.4 | 1.0 |
| | 0.013 | 100 | 165 | 1.9 | 4.9 | 1.1 |
| | 0.13 | 1000 | 1112 | 13 | 7.0 | 1.6 |
| C | 0 | 0 | 165 | 1.0 | 4.2 | 1.0 |
| | 0.013 | 100 | 217 | 1.3 | 4.2 | 1.0 |
| | 0.13 | 1000 | 944 | 5.7 | 5.7 | 1.4 |

*(Value for slurry with $K_2WO_4$ spike)/(Value for slurry without $K_2WO_4$ spike). $K_2WO_4$-free slurry = 1.0.

The other important parameter for TEOS removal rate robustness against W polishing is abrasive amount. In some embodiments, the slurry may contain a W corrosion inhibitor (e.g., a nitrogen-containing W corrosion inhibitor such as benzotriazole).

EQUIVALENTS

The present technology is not to be limited in terms of the particular embodiments described in this application, which are intended as single illustrations of individual aspects of the present technology. Many modifications and variations of this present technology can be made without departing from its spirit and scope, as will be apparent to those skilled in the art. Functionally equivalent methods and apparatuses within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, reagents, compounds compositions, or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member. Thus, for example, a group having 1-3 items refers to groups having 1, 2, or 3 items. Similarly, a group having 1-5 items refers to groups having 1, 2, 3, 4, or 5 items, and so forth.

All numerical designations, e.g., pH, temperature, time, concentration, amounts, and molecular weight, including ranges, are approximations which are varied (+) or (−) by 10%, 1%, or 0.1%, as appropriate. It is to be understood, although not always explicitly stated, that all numerical designations may be preceded by the term "about." As used herein, the term "about" will be understood by persons of ordinary skill in the art and will vary to some extent depending upon the context in which it is used. If there are uses of the term which are not clear to persons of ordinary skill in the art given the context in which it is used, "about" will mean up to plus or minus 10% of the particular term. It is also to be understood, although not always explicitly stated, that the reagents described herein are merely exemplary and that equivalents of such are known in the art.

All patents, patent applications, provisional applications, and publications referred to or cited herein are incorporated by reference in their entirety, including all figures and tables, to the extent they are not inconsistent with the explicit teachings of this specification. Other embodiments are set forth in the following claims.

This application is based on U.S. provisional Patent Application No. 63/083,461 filed Sep. 25, 2020, the disclosure of which is incorporated herein by reference in its entirety.

What is claimed is:

1. A method for polishing a surface comprising W, TEOS/$SiO_2$, and SiN, the method comprising:
   polishing the surface comprising W, TEOS/$SiO_2$, and SiN by applying a polishing slurry to the surface comprising W, TEOS/$SiO_2$, and SiN, wherein the polishing slurry comprises:
   an abrasive, wherein the abrasive is an anionic modified colloidal silica comprising an anionic group-containing compound chemically bonded to a surface of colloidal silica particles,
   a SiN polishing rate enhancer selected from the group consisting of an amino acid and heterocycle carbon compounds, and
   an anionic surfactant,
   wherein an electrical conductivity value of the polishing slurry is 100 μS/cm to 350 μS/cm, and
   wherein the polishing achieves a ratio of SiN removal to TEOS removal greater than about 40:1 when polishing the surface comprising W, TEOS/$SiO_2$, and SiN using the polishing slurry.

2. The method of claim 1, wherein the anionic group is a sulfonic acid group.

3. The method of claim 2, wherein the anionic modified colloidal silica is obtained by coupling a silane coupling agent having a thiol group to the colloidal silica particles and then oxidizing the thiol group using hydrogen peroxide.

4. The method of claim 1, wherein the electrical conductivity value of the polishing slurry is 100 μS/cm or more and less than 300 μS/cm.

5. The method of claim 1, wherein the polishing slurry has a pH of about 4 to about 5.

6. The method of claim 1, wherein the anionic surfactant is selected from a sulfonic acid type surfactant.

7. The method of claim 1, wherein an amount of the SiN polishing rate enhancer is about 0.1 to about 0.8 wt. %.

8. The method of claim 1, wherein an amount of abrasive is about 0.8 wt. % or less.

9. The method of claim 1, wherein the polishing is performed in the presence of $WO_4^{2-}$.

10. The method of claim 9, wherein the polishing slurry has a pH of 5.5 or less.

11. The method of claim 9, wherein the anionic modified colloidal silica has a negative zeta potential across the whole pH range of 2 to 12.

* * * * *